(12) United States Patent
Gmitter et al.

(10) Patent No.: US 9,994,936 B2
(45) Date of Patent: Jun. 12, 2018

(54) OFF-AXIS EPITAXIAL LIFT OFF PROCESS

(75) Inventors: Thomas Gmitter, Sunnyvale, CA (US); Gang He, Cupertino, CA (US); Melissa Archer, San Jose, CA (US); Siew Neo, Sunnyvale, CA (US)

(73) Assignee: Alta Devices, Inc., Sunnyvale, CA (US)

( * ) Notice: Subject to any disclaimer, the term of this patent is extended or adjusted under 35 U.S.C. 154(b) by 1128 days.

(21) Appl. No.: 13/210,138

(22) Filed: Aug. 15, 2011

(65) Prior Publication Data

US 2013/0042801 A1 Feb. 21, 2013

(51) Int. Cl.

| | | |
|---|---|---|
| *C30B 19/00* | (2006.01) | |
| *C22C 29/00* | (2006.01) | |
| *C30B 33/06* | (2006.01) | |
| *C30B 29/42* | (2006.01) | |
| *C30B 29/40* | (2006.01) | |
| *C30B 33/08* | (2006.01) | |
| *C30B 29/00* | (2006.01) | |
| *C30B 33/10* | (2006.01) | |

(52) U.S. Cl.
CPC .............. *C22C 29/00* (2013.01); *C30B 33/06* (2013.01); *C30B 29/00* (2013.01); *C30B 29/40* (2013.01); *C30B 29/42* (2013.01); *C30B 33/08* (2013.01); *C30B 33/10* (2013.01)

(58) Field of Classification Search
CPC ................................ C22C 29/00; C30B 33/06
USPC ...................................................... 117/58, 95
See application file for complete search history.

(56) References Cited

U.S. PATENT DOCUMENTS

| | | | | |
|---|---|---|---|---|
| 5,773,874 A | * | 6/1998 | Einthoven | ........... H01L 21/3083 257/170 |
| 2002/0097962 A1 | * | 7/2002 | Yoshimura et al. | ............ 385/50 |
| 2004/0188804 A1 | * | 9/2004 | Nakayama | ............ H01L 23/544 257/620 |
| 2008/0224270 A1 | * | 9/2008 | Ikubo et al. | .................. 257/618 |
| 2010/0120233 A1 | * | 5/2010 | He | .................... C23C 16/45519 438/478 |

(Continued)

FOREIGN PATENT DOCUMENTS

WO WO 2006072493 A1 * 7/2006 ............. H01L 21/78

OTHER PUBLICATIONS

GaAs photovoltaics and optoelectronics using releasable multilayer epitaxial assemblies, Yoon et al., vol. 465| May 20, 2010, pp. 329-334 and supplementary information.*

(Continued)

*Primary Examiner* — Hua Qi
(74) *Attorney, Agent, or Firm* — Perkins Coie LLP

(57) ABSTRACT

Embodiments described herein provide processes for forming and removing epitaxial films and materials from growth wafers by epitaxial lift off (ELO) processes. In some embodiments, the growth wafer has edge surfaces with an off-axis orientation which is utilized during the ELO process. The off-axis orientation of the edge surface provides an additional variable for controlling the etch rate during the ELO process- and therefore the etch front may be modulated to prevent the formation of high stress points which reduces or prevents stressing and cracking the epitaxial film stack. In one embodiment, the growth wafer is rectangular and has an edge surface with an off-axis orientation rotated by an angle greater than 0° and up to 90° relative to an edge orientation of <110> at 0°.

10 Claims, 4 Drawing Sheets

(56) References Cited

U.S. PATENT DOCUMENTS

2011/0006309 A1* 1/2011 Momose et al. ............... 257/77
2011/0095399 A1* 4/2011 Spitz et al. ................... 257/603

OTHER PUBLICATIONS

Anisotropic Chemical Etching of III—V Crystals, Dissolution Slowness Surface and Application to GaAs, Tellier et al., Active and Passive Electronic Components, Sep. 2004, vol. 27, pp. 133-154.*
Tellier et al., "Anisotropic Chemical Etching of III-V Crystals, Dissolution Slowness Surface and Application to GaAs", Active and Passive Electronic Components, Sep. 2004, vol. 27, pp. 133-154.
Yoon et al., "GaAs photovoltaics and optoelectronics using releasable multilayer epitaxial assemblies", vol. 465(20) May 2010, (52 pages total).

* cited by examiner

OFF-AXIS EPITAXIAL LIFT OFF PROCESS

BACKGROUND OF THE INVENTION

Field of the Invention

Embodiments of the invention generally relate to epitaxial lift off (ELO) processes.

Description of the Related Art

One phase in device fabrication involves handling and packaging of thin films used in photovoltaic, semiconductor, or other devices. Such thin film devices may be manufactured by utilizing a variety of processes for depositing and removing materials onto a wafer or other substrate. FIG. 1 shows a typical wafer 101 that is used as a growth substrate. Wafer 101 has a flat cut 103 which indicates its crystallographic orientation. This wafer is typically diced into a rectangular or square configuration 105. An edge of the rectangle or square 105 aligns with that of a flat cut 103. The edges of the rectangle or square 105 are either parallel or perpendicular to flat cut 103. This is referred to as an "on-axis" orientation.

One common technique for manufacturing thin film devices is known as the epitaxial lift off (ELO) process. In an ELO process, an epitaxial material or film, often containing multiple layers, is formed on a sacrificial layer which is deposited on the growth wafer. The sacrificial layer is etched away and the epitaxial film is separated from the growth wafer. The isolated thin epitaxial film may then be further processed and incorporated into a final product, such as in photovoltaic, semiconductor, or other devices.

The sacrificial layer is typically very thin and is usually etched away via a wet chemical process. The speed of the overall process may be limited by the lack of delivery or exposure of reactant to the etch front, which leads to less removal of by products from the etch front. The etching process is partially a diffusion limited process, and if the films were maintained in their deposited geometries, a very narrow and long opening would form to severely limit the overall speed of the process. To lessen the transport constraint of the diffusion processes, it may be beneficial to open up the resulting gap created by the etched or removed sacrificial layer and bending the epitaxial film away from the growth wafer. A crevice is formed between the epitaxial film and growth wafer, providing greater transport of species both towards and away the etch front. Reactants move towards the etch front while by-products generally move away from the etch front.

Furthermore, the epitaxial films grown on nearly rectangular or square growth wafers, or other wafers having sharp angles, are especially susceptible to developing corner cracks during the ELO processes. Basically, the diagonal corner regions experience similar or a slightly slower etch rate compared to the straight edges. This results in the corners of the sacrificial layer 201 becoming narrower, more pointed and pronounced, as depicted in FIG. 2. These narrower corners holding down the epitaxial film endure correspondingly increased stresses when the epitaxial film is being separated.

Therefore, there is a need for a method to remove epitaxial films from the growth wafers without tearing the films during an ELO process, as well as to maintain or increase the throughput of the process.

SUMMARY

An off-axis epitaxial lift off process is disclosed. The growth wafer has edges oriented in a direction other than that of the natural cleavage plane. The corners of the growth wafer are etched at a faster rate relative to the edges. This results in less stress induced on the corners and thereby reduced corner cracking. This increases the yield.

BRIEF DESCRIPTION OF THE DRAWINGS

The accompanying drawings are incorporated in and form a part of this specification. The drawings illustrate embodiments. Together with the description, the drawings serve to explain the principles of the embodiments.

DETAILED DESCRIPTION

Embodiments described herein provide processes for forming and removing epitaxial films and materials from growth wafers by epitaxial lift off (ELO) processes. In some embodiments, the growth wafer has edge surfaces with an off-axis orientation which is utilized during the ELO process. Off-axis pertains to the rotation of an edge of the wafer from the nearest <110> orientation. The off-axis orientation of the edge surface provides an additional variable for controlling the etch rate during the ELO process—and therefore the etch front may be modulated to prevent the formation of high stress points between the epitaxial film stack and the growth wafer which reduces or prevents stressing and cracking the epitaxial film stack.

Figure 1:
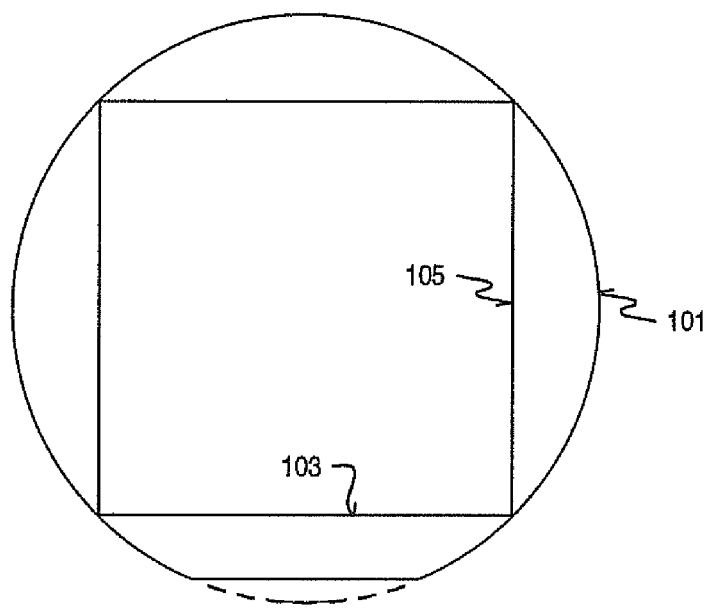
FIG. 1 shows a prior art on-axis oriented wafer.
Figure 2:
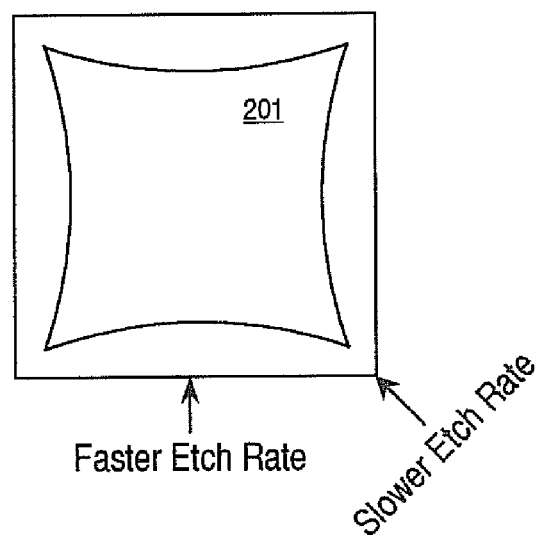
FIG. 2 shows a prior art on-axis orientation of a wafer as it is being etched.
Figure 3:
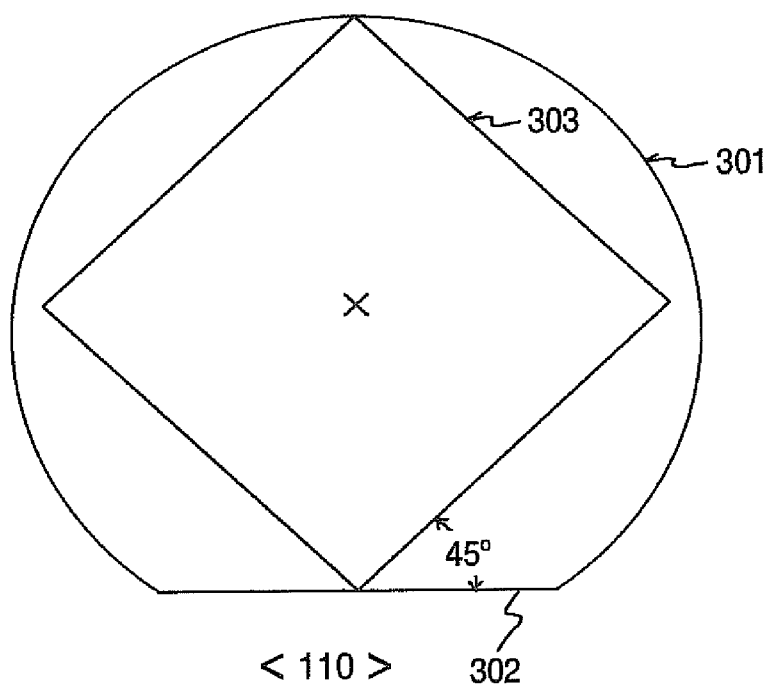
FIG. 3 shows an off-axis oriented wafer.

FIG. 3 shows an off-axis orientation of a wafer 301. The circular wafer 301 has a flat cut 302 that indicates its crystallographic orientation. Sometimes a notch will be used to indicate the crystallographic orientation of the circular wafer 301. This circular wafer is diced or cut into a rectangle or square 303, upon which the ELO process is performed. Alternatively, a rectangular or square crystal growth wafer 303 is diced out of the crystal boule. In other words, the edges of the rectangular or square growth wafer 303 are non-parallel and non-perpendicular to the cleavage plane as identified by the primary flat cut 302 or notch. The growth wafer has an edge that is oriented in a direction other than the natural cleavage plane. In the currently preferred embodiment, the rectangle or square growth wafer has edges at a 45 degree angle relative to the inherent crystallographic orientation as indicated by the flat cut 302. By dicing the growth wafer at an angle different from that of its natural, inherent crystallographic orientation, the orientation of the growth wafer can be controlled to take advantage of the different etch rates. In particular, the area(s) more susceptible to stresses and cracking can be oriented towards the faster etch rates. For rectangles and squares, the corners can be oriented to point towards the faster etch fronts.

Figure 4:
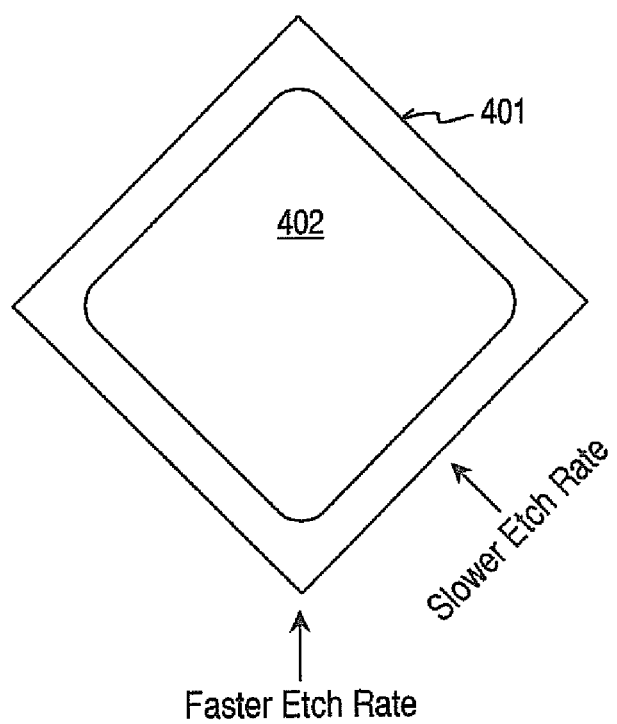
FIG. 4 shows an off-axis orientation of a wafer as it is being etched.

FIG. 4 shows a growth wafer having corners that experience relatively faster etch rates and edges that experience relatively slower etch rates. The square growth wafer 401 is off-axis by approximately 45 degrees. By virtue of this off-axis configuration, the corners are etched at a faster rate relative to its edges. In the currently preferred embodiment, the goal is to have corner etch rate of at lease 1.4 times that of the edge etch rate. Because the corners are etched away faster, they become more rounded. The rounded corners of the sacrificial layer 402 are far more desirable than the narrower, more pointed corners of the prior art because the rounded corners induce less stress during the lift-off process and the epitaxial layer is less susceptible to cracking. This improves the yield.

In embodiment herein, the method includes growing a sacrificial layer over a growth wafer, forming an epitaxial film stack over the sacrificial layer, and exposing the sacrificial layer to a wet etch solution during the ELO process. The ELO process includes etching the sacrificial layer, forming a crevice between the growth wafer and the epitaxial film stack, and separating the growth wafer from the epitaxial film stack The ELO etch process is a lateral etch process and the geometry or shape of the etch front may be modulated as a function of multiple variables including the crystalline lattice orientation, etch chemistry (e.g. solution composition), etch conditions (e.g., temperature and pressure), and curvature of the crevice (e.g., dynamic clamping). The growth wafers described herein have been specifically designed and created in order to have control of the lattice orientation at specified locations on the substrate. An off-axis orientation having a predetermined angle may be used to change the etch rate at the corners and sides of the sacrificial layer during the ELO process. For example, the off-axis orientation of the growth substrate provides faster etching planes at the corners of the sacrificial layer. Therefore, the corners may be etched at a faster rate than the sides of the sacrificial layer in order to provide that the etch front, coming from the corners and sides having corner and side fronts, to converge near the center of the substrate around the same time while forming a singularity between the epitaxial film stack and the growth wafer.

The growth wafers described herein which have edge surfaces with an off-axis orientation rotated by a predetermined angle may be manufactured or otherwise formed from a variety of different growth wafers. A crystalline wafer may contain various elements, including from Groups III, IV, and V, and initially may have a variety of different crystalline orientations.

In one example, a rectangular growth wafer is cut off-axis from a circular, crystalline, gallium arsenide wafer having a facial orientation of <001>.

The predetermined angle for the rotated off-axis orientation is measured from the <110> flat. The round wafer may be cut with a saw, such as a dice saw, or other cutting or slicing device used to cut crystalline wafers. The growth wafer is cut from the round wafer at the predetermined angle relative to the edge flat, such that the previously axis orientation is now rotated by the predetermined angle. The predetermined angle is greater than 0° and less than 90°.

In embodiments herein, the method includes exposing the sacrificial layer to a wet etch solution during the ELO process. The ELO process includes etching the sacrificial layer, forming a crevice between the growth wafer and the epitaxial film stack, and separating the growth wafer from the epitaxial film stack.

In another embodiment, the method further includes forming an etch front by exposing the sacrificial layer to the wet etch solution, wherein the etch front encompasses the sacrificial layer at the interface of the wet etch solution and the sacrificial layer. Prior to being exposed to the wet etch solution, the sacrificial layer has side edges and corners which form a rectangular geometry (e.g., rectangle or square). Once the sacrificial layer is exposed to the wet etch solution, the etch front advances towards the center of the growth wafer within the crevice while etching the sacrificial layer during the ELO process. The etch geometry of the sacrificial layer may be controlled to transitions to have substantially octagonal geometry and then to have substantially rounded geometry.

The etch front may have a rectangular geometry, conformal to the sacrificial layer when initially exposed. However, as the etching process progressed, the etch front generally forms an octagonal geometry containing alternating sides of side edge fronts and corner edge fronts. The growth wafer, as described herein having an edge surface with an off-axis orientation rotated by an angle greater than 0° and up to 90°, is utilized to etch the sacrificial layer at the corner edge fronts at a faster etch rate than at the side edge fronts. Therefore, the side edge fronts may be longer than the corner edge fronts during an initial duration of the ELO process, but subsequently, the side edge fronts and the corner edge fronts have the same length or substantially the same length during a later duration of the ELO process. The geometry of the etch front or the sacrificial layer are controlled and modulated between transitions during the ELO process. The geometry of the etch front or the sacrificial layer may transition from a substantially rectangular geometry, to a substantially octagonal geometry, and then to a substantially rounded geometry, such as a rounded singularity. In some examples, the substantially octagonal geometry of the etch front or the sacrificial layer transitions from a non-equilateral octagonal geometry to an equilateral or substantially equilateral octagonal geometry.

While the foregoing is directed to embodiments of the invention, other and further embodiments of the invention may be devised without departing from the basic scope thereof, and the scope thereof is determined by the claims that follow.

The invention claimed is:

1. A method for forming an epitaxial film stack during an epitaxial lift off process, the method comprising:
    providing a growth wafer made of gallium arsenide and diced from a round wafer at a predetermined angle to produce a plurality of edge surfaces on the growth wafer, each edge surface being oriented in a direction other than that of a cleavage plane of the round wafer that is indicative of a crystallographic orientation of the round wafer, wherein none of the plurality of edge surfaces has an orientation that is perpendicular to the crystallographic orientation of the round wafer indicated by the cleavage plane, and wherein none of the plurality of edge surfaces has an orientation that is parallel to the crystallographic orientation of the round wafer indicated by the cleavage plane;
    growing a sacrificial layer over the growth wafer;
    forming the epitaxial film stack over the sacrificial layer;
    removing the sacrificial layer by a lateral etching process, the lateral etching process including a first etch rate of the sacrificial layer near corners of the plurality of edge surfaces that is faster than a second etch rate of the sacrificial layer near sides of the plurality of edge surfaces; and
    separating the epitaxial film stack from the growth wafer after complete removal of the sacrificial layer.

2. The method of claim 1, wherein the orientation of each of the edge surfaces includes an off-axis orientation that is at an angle greater than 0° and less than 90° with respect to the crystallographic orientation of the round wafer, the crystallographic orientation being a <110> crystal lattice orientation.

3. The method of claim 1, wherein the lateral etching process produces an etch front of a wet etch solution that encompasses the sacrificial layer at the interface of the wet etch solution and the sacrificial layer.

4. The method of claim 3, wherein the etch front forms substantially octagonal geometry comprising alternating sides of a plurality of side edge fronts and corner edge fronts.

5. The method of claim 4, wherein the corner edge fronts advance at the first etch rate of the sacrificial layer near the corners of the plurality of edge surfaces and the side edge fronts advance at the second etch rate of the sacrificial layer near the sides of the plurality of edge surfaces.

6. The method of claim 4, wherein the plurality of side edge fronts and corner edge fronts converge at a center of the sacrificial layer at a same time to complete the removal of the sacrificial layer.

7. The method of claim 3, wherein the geometry of the etch front of the sacrificial layer transitions during the epitaxial lift off process from a substantially rectangular geometry, to a substantially octagonal geometry, and then to a substantially rounded geometry.

8. The method of claim 3, wherein the sacrificial layer has a rectangular geometry and comprises side edges and corners prior to being exposed to the wet etch solution.

9. The method of claim 1, wherein the predetermined angle is 45° and corresponds to an off-axis orientation of the growth wafer relative to the round wafer.

10. The method of claim 1, wherein the first etch rate is 1.4 times the second etch rate.

\* \* \* \* \*